US011101374B1

(12) United States Patent
Reznicek et al.

(10) Patent No.: US 11,101,374 B1
(45) Date of Patent: Aug. 24, 2021

(54) NANOSHEET GATED DIODE

(71) Applicant: International Business Machines Corporation, Armonk, NY (US)

(72) Inventors: Alexander Reznicek, Troy, NY (US); Bahman Hekmatshoartabari, White Plains, NY (US); Karthik Balakrishnan, Scarsdale, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/900,888

(22) Filed: Jun. 13, 2020

(51) Int. Cl.
*H01L 29/739* (2006.01)
*H01L 29/861* (2006.01)
*H01L 29/66* (2006.01)
*H01L 29/06* (2006.01)

(52) U.S. Cl.
CPC ...... *H01L 29/7391* (2013.01); *H01L 29/0669* (2013.01); *H01L 29/66356* (2013.01); *H01L 29/861* (2013.01)

(58) Field of Classification Search
CPC ........... H01L 29/7391; H01L 29/66356; H01L 29/0669; H01L 29/861
See application file for complete search history.

(56) References Cited

U.S. PATENT DOCUMENTS

| 6,835,967 | B2 | 12/2004 | Yeo et al. |
| 7,888,775 | B2 | 2/2011 | Russ et al. |
| 8,901,655 | B2 | 12/2014 | Chang et al. |
| 8,927,397 | B2 | 1/2015 | Chang et al. |
| 8,928,083 | B2 | 1/2015 | Chang et al. |
| 8,994,108 | B2 | 3/2015 | Chang et al. |
| 9,006,087 | B2 | 4/2015 | Chang et al. |
| 9,431,388 | B1 | 8/2016 | Gauthier, Jr. et al. |
| 9,842,835 | B1 | 12/2017 | Cheng et al. |
| 9,847,391 | B1 | 12/2017 | Zang et al. |
| 2014/0367782 | A1* | 12/2014 | Cheng ................. H01L 29/6609 257/350 |

* cited by examiner

*Primary Examiner* — Stephen M Bradley
*Assistant Examiner* — Wasiul Haider
(74) *Attorney, Agent, or Firm* — Daniel P. Morris; Lou Percello, Attorney, PLLC

(57) ABSTRACT

One or more gated nanosheet diodes are disposed on a substrate and made from a nanosheet structure. A first (second) source/drain (S/D) is disposed on the substrate. The first (second) S/D has a first (second) S/D doping concentration with a first (second) S/D doping type. One or more p-n junctions form one or more respective diodes. There is a first side and a second side of each of the p-n junctions. The first (second) sides of the p-n junctions electrically and physically connect to the first (second) S/Ds and have the same type of doping, respectively. A gate stack, made of a gate dielectric layer and a gate metal, interfaces and surrounds each of the p-n junctions.

20 Claims, 12 Drawing Sheets

NANOSHEET GATED DIODE

BACKGROUND

The present invention relates to an improved semiconductor diode. More specifically, the invention relates to one or more gated diodes and methods of making gated diodes from nanosheets.

A nanosheet is a thin semiconductor layer. Nanosheets are layered together to form nanosheet stacks.

Nanosheet technology is being pursed as a viable option for making small devices targeted for 5 nanometer (nm) technology. Nanosheet stacks are used as precursor structures for making devices like Field Effect Transistors (FETs).

Diodes are semiconductor devices that are prevalent in many circuitry applications including digital circuits, analog circuits, logic and control circuits, and electrostatic discharge circuits.

There is a need for effective nanosheet gated diode structures and methods of making gated diodes using nano technology. In addition, there is a need for methods and structures that integrate gated diodes with other components, like FETs, together in nanosheet structures.

SUMMARY

Embodiments of the present invention include one or more gated diode structures and methods of making gated diodes from and integrating gated diodes in a nanosheet structure.

The gated diodes include a substrate. A first source/drain (S/D) is disposed on the substrate. The first S/D has a first S/D doping concentration with a first S/D doping type. A second source/drain (S/D) is disposed on the substrate. The second S/D has a second S/D doping concentration with a second S/D doping type.

One or more p-n junctions each form a diode. Each p-n junction has a first side and a second side. The first side has a first side junction doping concentration with a first side junction doping type. The first side junction doping type is the same type as the first S/D doping type and the first side of the p-n junction is electrically and physically connected to the first S/D. The second side has a second side junction doping concentration with a second side junction doping type. The second side junction doping type is the same type as the second S/D doping type and the second side of the p-n junction is electrically and physically connected to the second S/D.

A gate dielectric layer interfaces and surrounds each of the p-n junctions and a gate metal surrounds the gate dielectric layers. The gate metal and the gate dielectric layer form a gate stack surrounding each of the p-n junctions.

BRIEF DESCRIPTION OF THE DRAWINGS

Various embodiments of the present invention will be described below in more detail, with reference to the accompanying drawings, now briefly described. The Figures show various apparatus, structures, and related method steps of the present invention.

DETAILED DESCRIPTION

Figure 1:
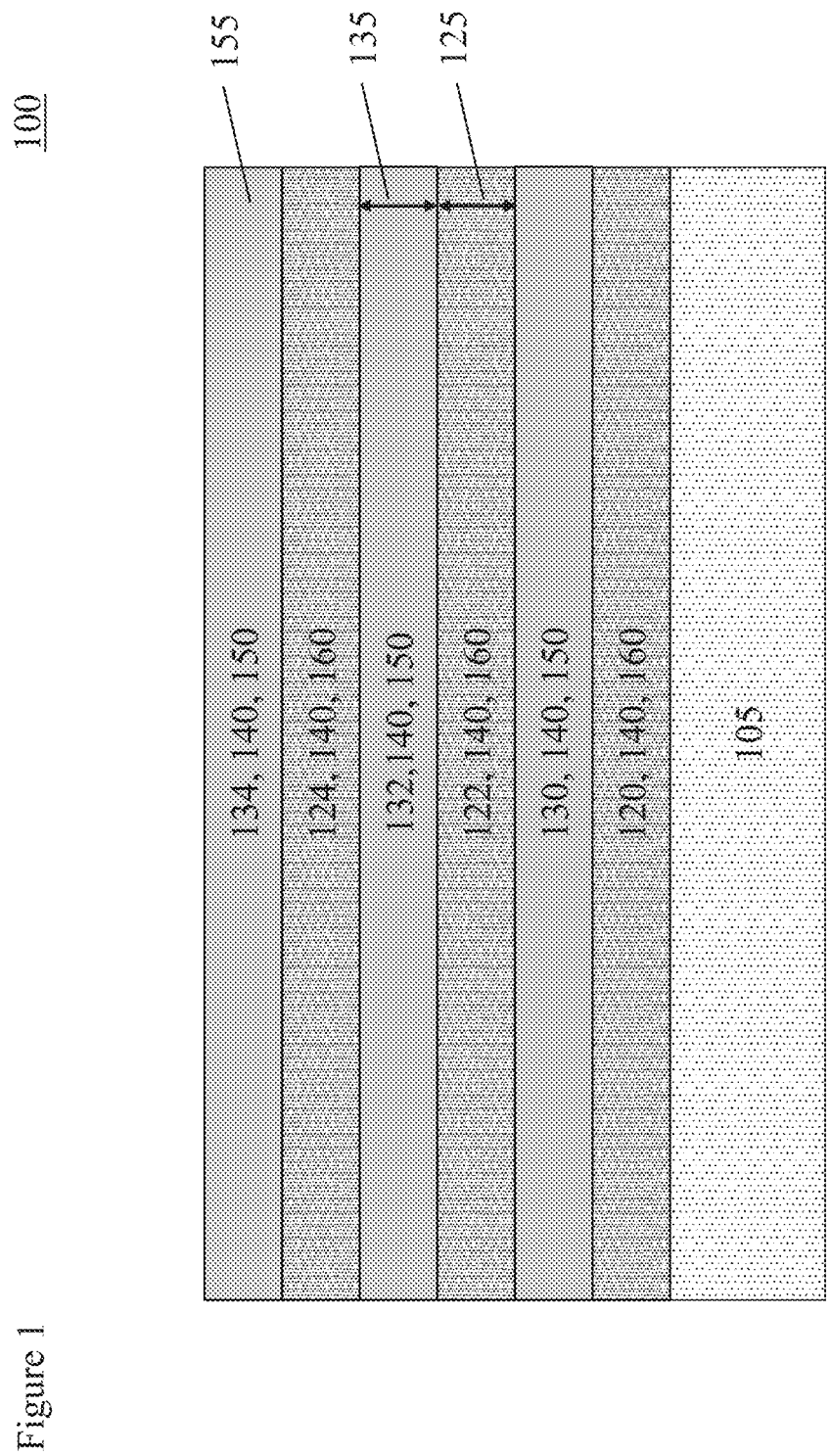
FIG. 1 is a cross-section view of an interim layered structure, e.g. a nanosheet stack.

It is to be understood that embodiments of the present invention are not limited to the illustrative methods, apparatus, structures, systems and devices disclosed herein but instead are more broadly applicable to other alternative and broader methods, apparatus, structures, systems and devices that become evident to those skilled in the art given this disclosure.

In addition, it is to be understood that the various layers, structures, and/or regions shown in the accompanying drawings are not drawn to scale, and that one or more layers, structures, and/or regions of a type commonly used may not be explicitly shown in a given drawing. This does not imply that the layers, structures, and/or regions not explicitly shown are omitted from the actual devices.

In addition, certain elements may be left out of a view for the sake of clarity and/or simplicity when explanations are not necessarily focused on such omitted elements. Moreover, the same or similar reference numbers used throughout the drawings are used to denote the same or similar features, elements, or structures, and thus, a detailed explanation of the same or similar features, elements, or structures may not be repeated for each of the drawings.

The semiconductor devices, structures, and methods disclosed in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, expert and artificial intelligence systems, functional circuitry, neural networks, etc. Systems and hardware incorporating the semiconductor devices and structures are contemplated embodiments of the invention.

As used herein, "height" refers to a vertical size of an element (e.g., a layer, trench, hole, opening, etc.) in the cross-sectional or elevation views measured from a bottom surface to a top surface of the element, and/or measured with respect to a surface on which the element is located.

Conversely, a "depth" refers to a vertical size of an element (e.g., a layer, trench, hole, opening, etc.) in the cross-sectional or elevation views measured from a top surface to a bottom surface of the element. Terms such as "thick", "thickness", "thin" or derivatives thereof may be used in place of "height" where indicated.

As used herein, "lateral," "lateral side," "side," and "lateral surface" refer to a side surface of an element (e.g., a layer, opening, etc.), such as a left or right-side surface in the drawings.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the elevation views, and "horizontal" refers to a direction parallel to the top surface of the substrate in the elevation views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop," "disposed on," or the terms "in contact" or "direct contact" means that a first element and a second element are connected without any intervening elements, such as, for example, intermediary conducting, insulating or semiconductor layers, present between the first element and the second element.

It is understood that these terms might be affected by the orientation of the device described. For example, while the meaning of these descriptions might change if the device was rotated upside down, the descriptions remain valid because they describe relative relationships between features of the invention.

The Figures present a series of interim structures and different method steps which lead to embodiments of one or more nanosheet gated diodes. In one non-limiting example embodiment, the epitaxial growth of a first source/drain, e.g. made of an n-type material. A first part of the epitaxial growth of the first source/drain is a channel epitaxy where the n-type material epitaxially grows into an etched-out space in one or more recessed channels containing semiconductor material of an opposite type, e.g. a p-type material.

Various embodiments of "all-around" gates are disclosed. For example, all-around gates can be gates in direct contact (interface) with a top, bottom, front, and back surfaces of one or more channels (and p-n junctions) in which each of the p-n junctions, i.e. diodes, are formed. In embodiments where the gates are one unified structure surrounding ("all-around") all of each of the individual parallel channels/p-n junctions and all the p-n junctions are subject to the same gate voltage at the same time.

Refer now to the Figures.

FIG. 1 is a cross-section view of an interim layered structure 100. The beginning structure 100 is a layer of nanosheets disposed on a substrate 105. Each nanosheet (120, 130, 122, 132, 124, and 134, typically 140) is either a channel layer (130, 132, and 134, typically 150) or an all-around dummy gate layer (120, 122, 124, typically 160). The channel layers 150 and all-around dummy gate layers 160 alternate, one disposed on the other, to form the layers of nanosheets 140.

The substrate 105 can be made from a single element (e.g., silicon or germanium); primarily a single element (e.g., a doped material), for example doped silicon; or a compound semiconductor, for example, gallium arsenide (GaAs); or a semiconductor alloy, for example silicon-germanium (SiGe). Non-limiting examples of the substrate 105 materials include one or more semiconductor materials like silicon (Si), silicon-germanium (SiGe), Si:C (carbon doped silicon), germanium (Ge), carbon doped silicon germanium (SiGe:C), Si alloys, Ge alloys, III-V materials (e.g., GaAs, Indium gallium arsenide (InGaAs), indium arsenide (InAs), indium phosphide (InP), aluminum arsenide (AlAs), etc.), II-V materials (e.g., cadmium selenide (CdSe), cadmium sulfide (CdS), or any combination thereof), or other like semiconductors. In addition, multiple layers of the semiconductor materials can make up the substrate 105. In some embodiments, the substrate 105 includes both semiconductor materials and dielectric materials. In some silicon on insulator (SOI) implementations, a buried oxide layer, BOX, (e.g., SiO2) is buried in the substrate 105.

The channel layers 150 are made of a semiconductor material.

The channel layers 150 have the same type of doping as the second S/Ds 950 (described below), however, the doping levels or doping concentrations (typically 155) of the channel layers 150 are lower than the doping levels/concentrations of the second S/Ds. (See a more detailed description of the second S/D 950, below.)

If the second S/Ds 950 and channel layers 150 are p-type doped, dopants can be selected from a non-limited group of boron (B), gallium (Ga), indium (In), and thallium (Tl). If the second S/Ds and channel layers 150 are n-type doped, dopants can be selected from a non-limited group of phosphorus (P), arsenic (As) and antimony (Sb).

In some embodiments, the channel layers 150 have a channel layer 150 thickness 135 ranging between 5 and 12 nanometers (nm).

Channel layer 150 doping levels/concentrations vary. For example, for an p-type doping, the channel layers 150 can be doped, e.g. with boron (B), with a concentration between $1\times10^{17}$ cm$^{-3}$ and $1\times10^{19}$ cm$^{-3}$. For a n-type doping, the channel layers 150 can be doped, e.g. with phosphorous (P), with a concentration between $1\times10^{19}$ cm$^{-3}$ and $4\times10^{20}$ cm$^{-3}$. Other doping levels/concentrations 155 and channel layer thicknesses 135 are possible.

In a non-limiting example, the channel layers 150 are made of silicon with a p-type doping of boron (B) with a concentration between $1\times10^{17}$ cm$^{-3}$ and $1\times10^{19}$ cm$^{-3}$.

The all-around dummy gate layers 160 are made of sacrificial material that can be removed by processes that do not affect other materials of the structure 100, e.g. materials making the substrate 105 and channel layers 150. In some embodiments, the all-around dummy gate layers 160 are made of silicon-germanium (SiGe).

The thickness 125 of the all-around dummy gate layers 160 is between 6 nm and 20 nm, with an 8 nm to 10 nm thickness preferred. Other thicknesses are possible.

In some embodiments, the nanosheet layers 140 are epitaxially grown on top of one another. The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface.

In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, each semiconductor layer of the epitaxial semiconductor material stack has the same crystalline characteristics as the deposition surface on which it is formed.

Examples of various epitaxial growth process apparatuses that can be employed in the present invention include, for example, rapid thermal chemical vapor deposition (RT-CVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C.

In some embodiments, the gas source for the epitaxial growth may include a silicon containing gas source and/or an admixture of a germanium containing gas source. Examples of silicon gas sources include silane, disilane, trisilane, tetrasilane, hexachlorodisilane, tetrachlorosilane, dichlorosilane, trichlorosilane, and combinations thereof. Examples of germanium gas sources include germane, digermane, or combinations thereof. In some embodiments, an epitaxial SiGe alloy can be formed from a source gas that includes a compound containing silicon and germanium. Carrier gases like hydrogen, helium, and argon can be used. During the epitaxial growth of a layer an appropriate type dopant can be added to the precursor gas or gas mixture.

In some embodiments of channel layer 150 materials, no dopant is present in, or added into, the precursor gas or gas mixture. In other embodiments, the channel layers 150 are doped with a dopant in the gas mixture but at a lower doping concentration than the second S/Ds 950, as described below.

In a preferred embodiment, layers 140 are grown by an integrated epitaxy process. In an integrated epitaxy process the structure is epitaxially grown continuously while the type of gas source and type and/or the concentration of dopants changes at different times and time periods to create the different layers with different dopants and dopant concentrations. Some temperature adjustments may be made for one or more of the layers during the epitaxial growth as well.

The nanosheet layers 140 are grown on top of one another as described below to complete the structure 100. The grown channel layers 150 can be in-situ doped, meaning dopants are incorporated into the epitaxy layers during the growth/deposition of the respective epitaxial channel layer 150.

In some embodiments, the source gas is changed to create the all-around dummy gate layers 160. Typically, the all-around dummy gate layers 160 are not doped. Doping of the all-around dummy gate layers 160 is inconsequential because these layers 160 are sacrificial.

In some embodiments, 2 or 3 channel layers 150 are formed. Formation of more channel layers 150 is possible.

Creating the structure 100 by epitaxial growing nanolayers 140 allows for accurate control of nanolayer 140 thickness and doping levels. Further, there is no alignment of layers needed during the nanolayer 140 growth.

Figure 2:
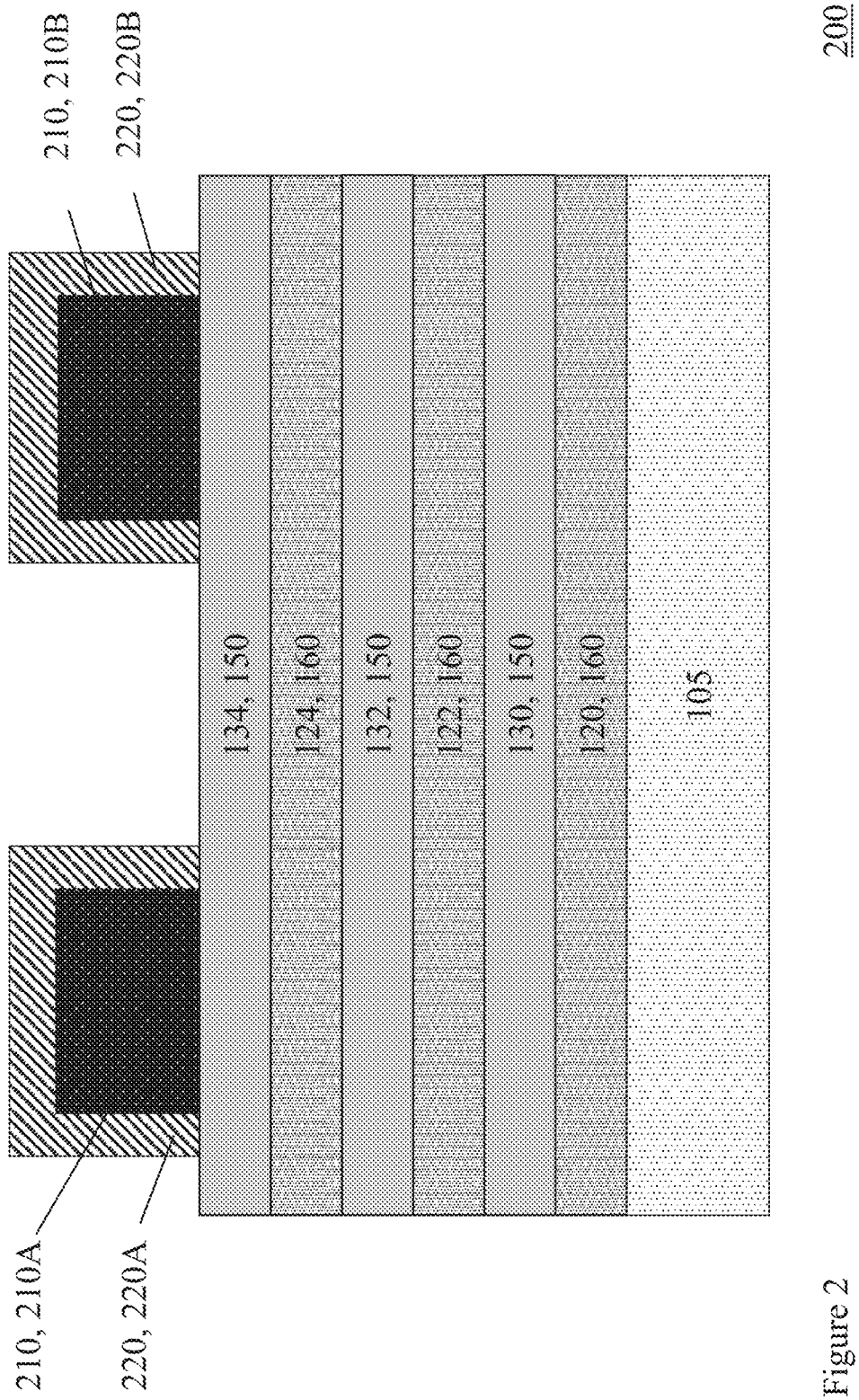
FIG. 2 is the cross-section view of a pair of dummy gates and a pair of gate spacers disposed on the interim structure of FIG. 1.

FIG. 2 is the cross-section view 200 of a pair (210A, 210B) of dummy gates 210 and a pair (220A, 220B) of gate spacers 220 disposed on the interim structure 100.

The dummy gate 210 and gate spacer 220 are formed by well-known methods. For example, the dummy gate material 210 is deposited through a mask. After mask removal the gate spacer material 220 is conformally deposited and a directional etch back is performed. The dummy gates 210 are made of a sacrificial material that is selectively different chemically from the gate spacer 220 material.

The dummy gate 210 material can include, for example, amorphous silicon ($\alpha$-Si) or polycrystalline silicon (polysilicon). In some embodiments, the dummy gate material is the same material as the same material as the all-around dummy gate layers 160, e.g. SiGe. The dummy gate 210 material may be deposited by a deposition process, including, but not limited to, physical vapor deposition (PVD), chemical vapor deposition (CVD), and plasma enhanced chemical vapor deposition (PECVD). The dummy gate 210 has a thickness of about 10 nm to about 100 nm, or 20 nm to 50 nm. Other thicknesses are possible.

The gate spacer 220 material can be deposited by known techniques like PVD, CVD, or atomic layer deposition (ALD) and can be made of materials like silicon nitride (SiN), silicon boron nitride (SiBN), siliconborocarbonitride (SiBCN), silicon oxycarbonitride (SiOCN), dielectric oxynitrides, or dielectric oxides like silicon oxide (SiOx). The thickness of the gate spacer 220 can be between 3 nm to 15 nm, although other thicknesses are possible. In some embodiments, the gate spacer 220 is SiN.

Figure 3:
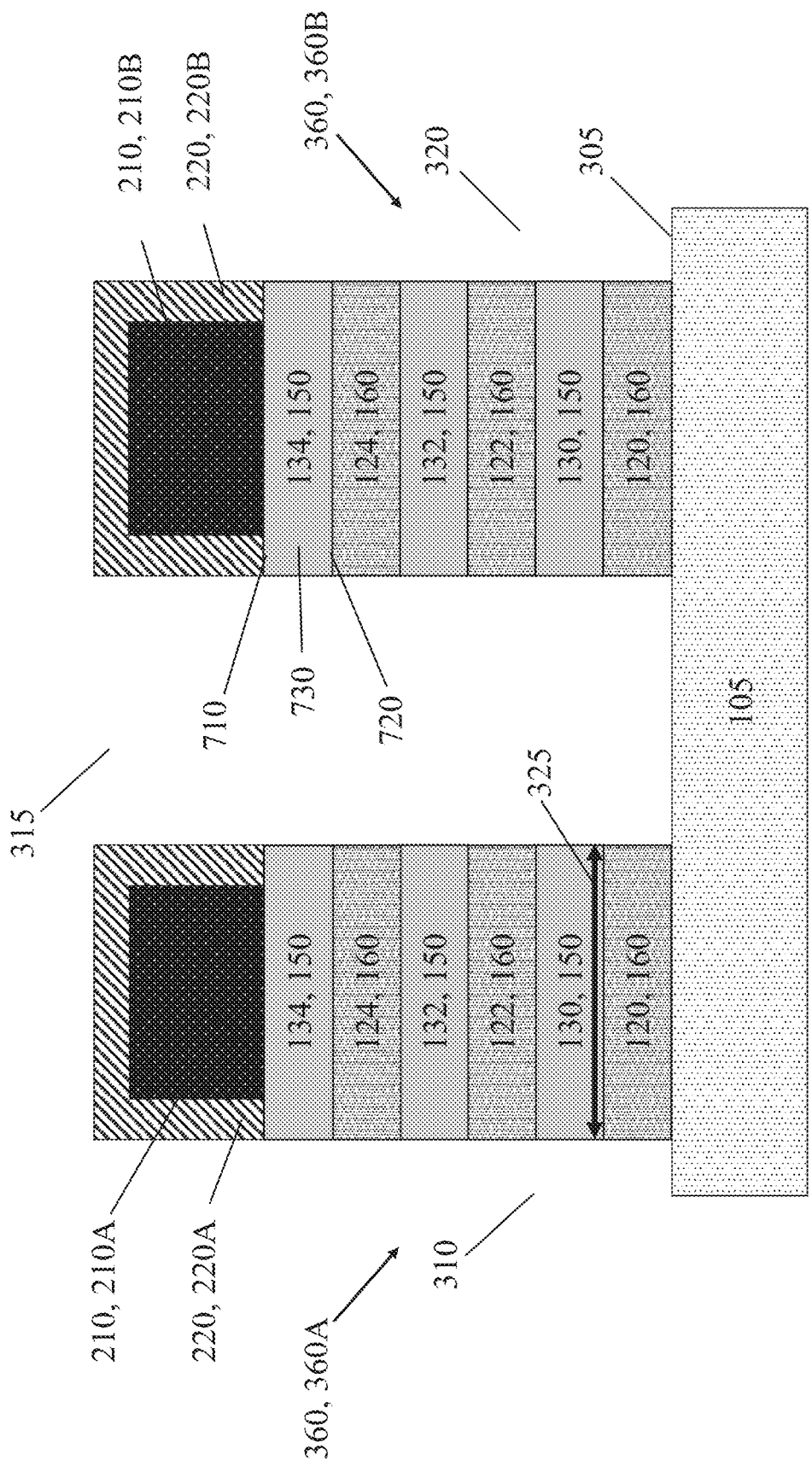
FIG. 3 is a cross-section view of an interim layered nanosheet structure with regions removed to form a pair of stacks.

FIG. 3 is a cross-section view of an interim structure 300 of a pair of stacks 360 with regions (310, 315, 320) removed to enable growth of masks and source/drain regions, as described below. For example, regions between 315 the pair of stacks 360 and beside (310, 320) the stacks will be void of material above the substrate 105.

In some embodiments, the gate spacer 220 is used as a mask in a direction reactive ion etch (RIE) process that etches the nanolayers 140 away in regions 310, 315, and 320 while leaving a pair (360A, 360B) of stacks 360 of the nanolayers 140 under each of the gate spacers 220. In some embodiments, the RIE etching is a series of different RIEs as required for the chemistry of the layer 140 being removed. The RIE stops when the surface 305 of the substrate 105 is reached, using known techniques like end point detection, i.e. monitoring when the material of the last removed layer 120 stops being detected.

Each of the pair of stacks has one or more channels 730 with a channel top 710 and a channel bottom 720. The channels 730 are distinguished from the channel layers 150 which include the material inside the respective channel 730. The channels 730 also have a channel width 325.

Figure 4:
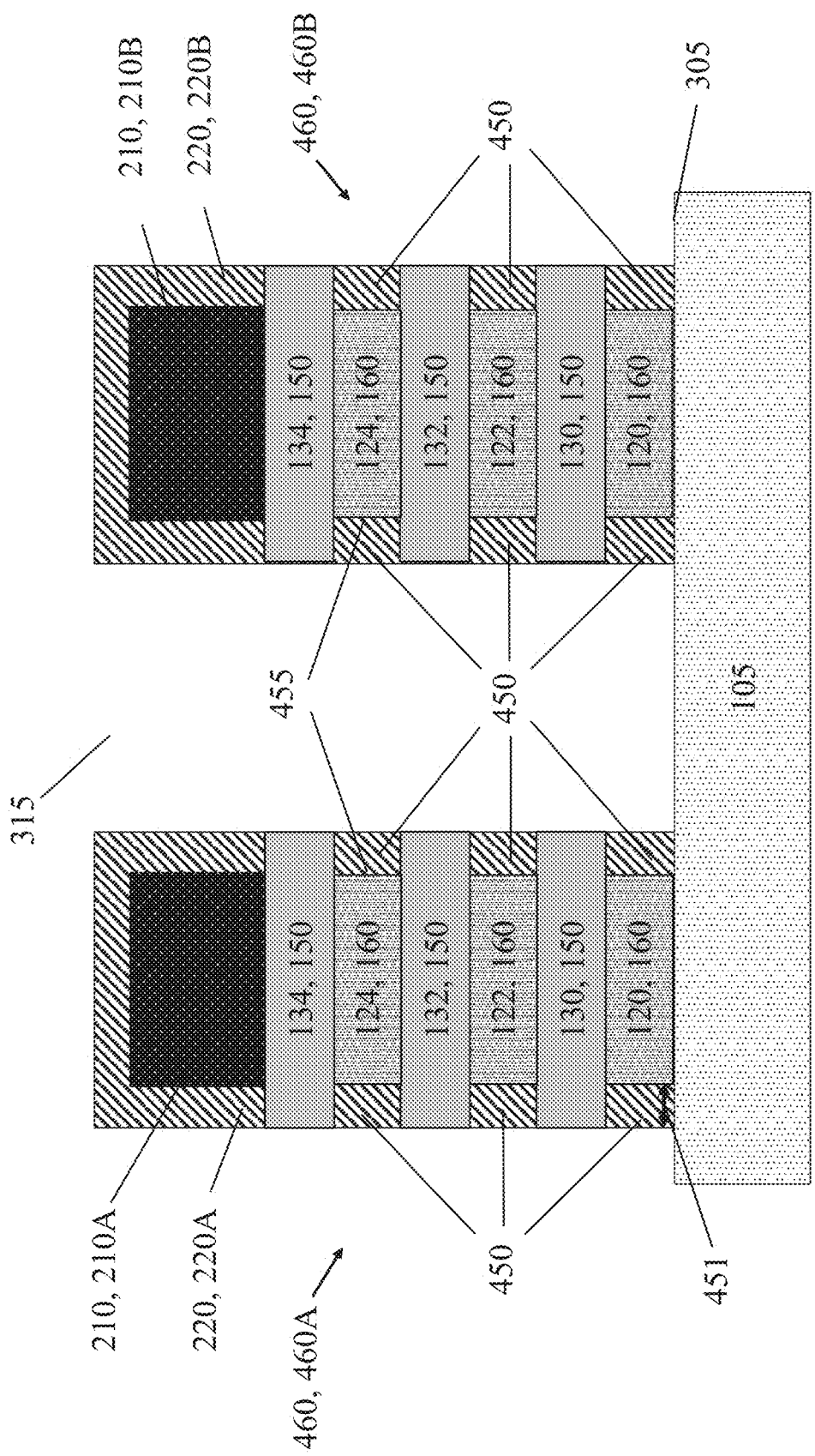
FIG. 4 is a cross-section view of an interim structure with inner spacers formed on each of the pair of stacks.

FIG. 4 is a cross-section view of an interim structure 400 with inner spacers 450 creating a pair (460A, 460B) of spacer stacks 460. The inner spacers 450 are formed at the ends, typically 455 of each all-around dummy gate layer 160 and protect the all-around dummy gate layer 160 in some of the next processing steps.

Inner spacer 450 formation begins with a partial etch back of the all-around dummy gate layers 160. The etching chemistry selectively removes the material, e.g. SiGe, in the all-around dummy gate layers 160 and does not affect the materials in the channel layers 150 or gate spacers 220. For example, the structure 300 is exposed for a timed period to known chemistries like a gaseous HCl. There are other available methods, e.g. developed by TEL, Tokyo Electron Ltd.

The length of the time is determined empirically to recess the ends 455 of the all-around dummy gate layers 160 the required distance 451.

After the ends 455 are recessed, the inner spacer 450 material is conformally deposited. Known processes (e.g. a masked directional etch) re-define the sides of the spacer stacks 460 and remove spacer material from the surface 305 of the substrate 105.

Inner spacer 450 materials and deposition techniques can be those used in formation of the gate spacer 220. In some embodiments, the inner spacers 450 are made of silicon nitride (SiN). The thickness 451 of the inner spacers 450 is between 3 nm and 8 nm. Other thicknesses are possible.

Figure 5:
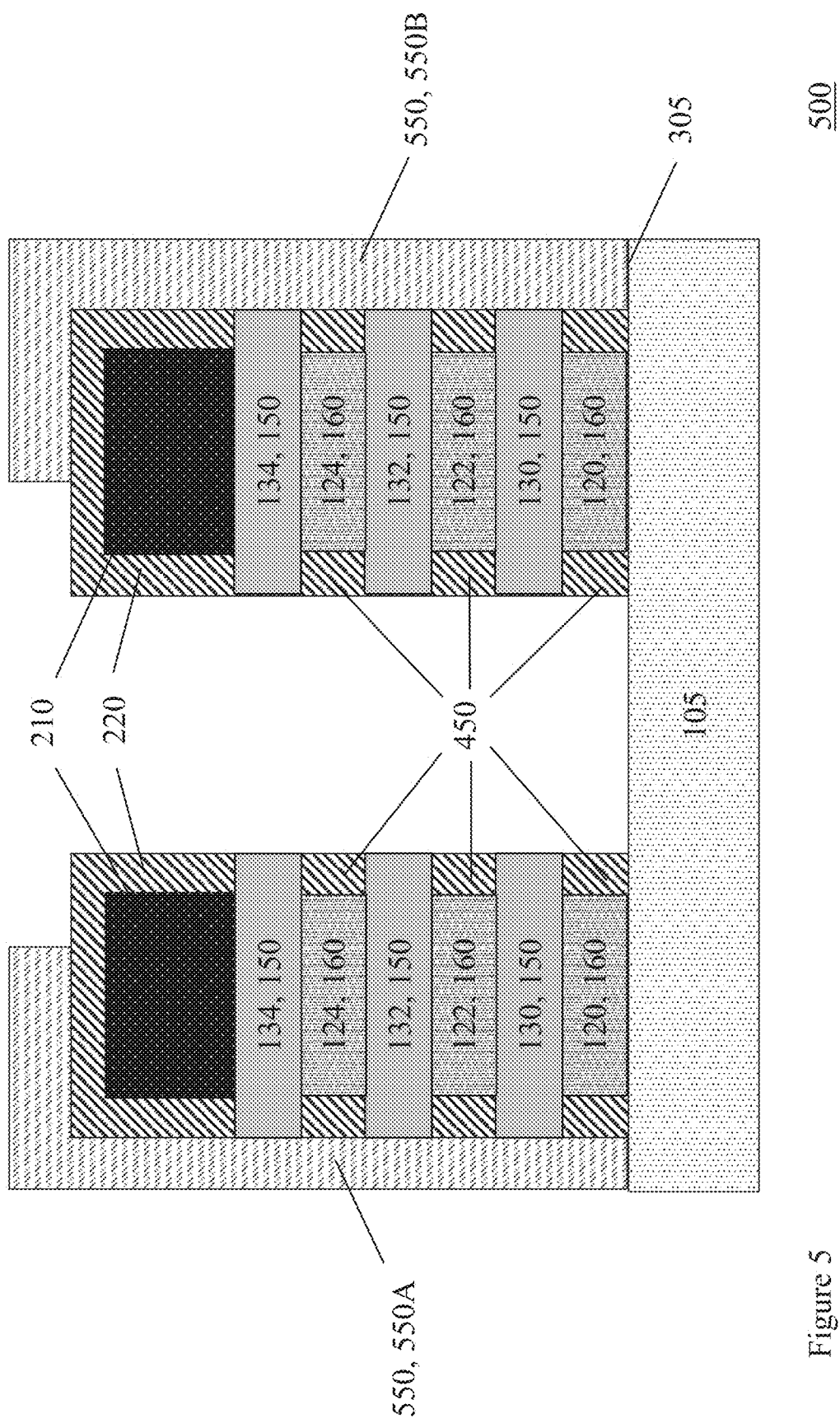
FIG. 5 is a cross-section view of an interim structure after deposition of a pair of masks, where each mask masks half of a stack.

FIG. 5 is a cross-section view of an interim structure 500 after deposition of a pair (550A, 550B) of half masks 550, where each half mask 550 masks half of a spacer stack 460.

In some embodiments, the half masks 550 are made of a material that does not support epitaxial growth, like an oxide, including silicon dioxide ($SiO_2$). The half mask 550 material is also chemically selective from the material making up the channel layers 150.

Figure 6:
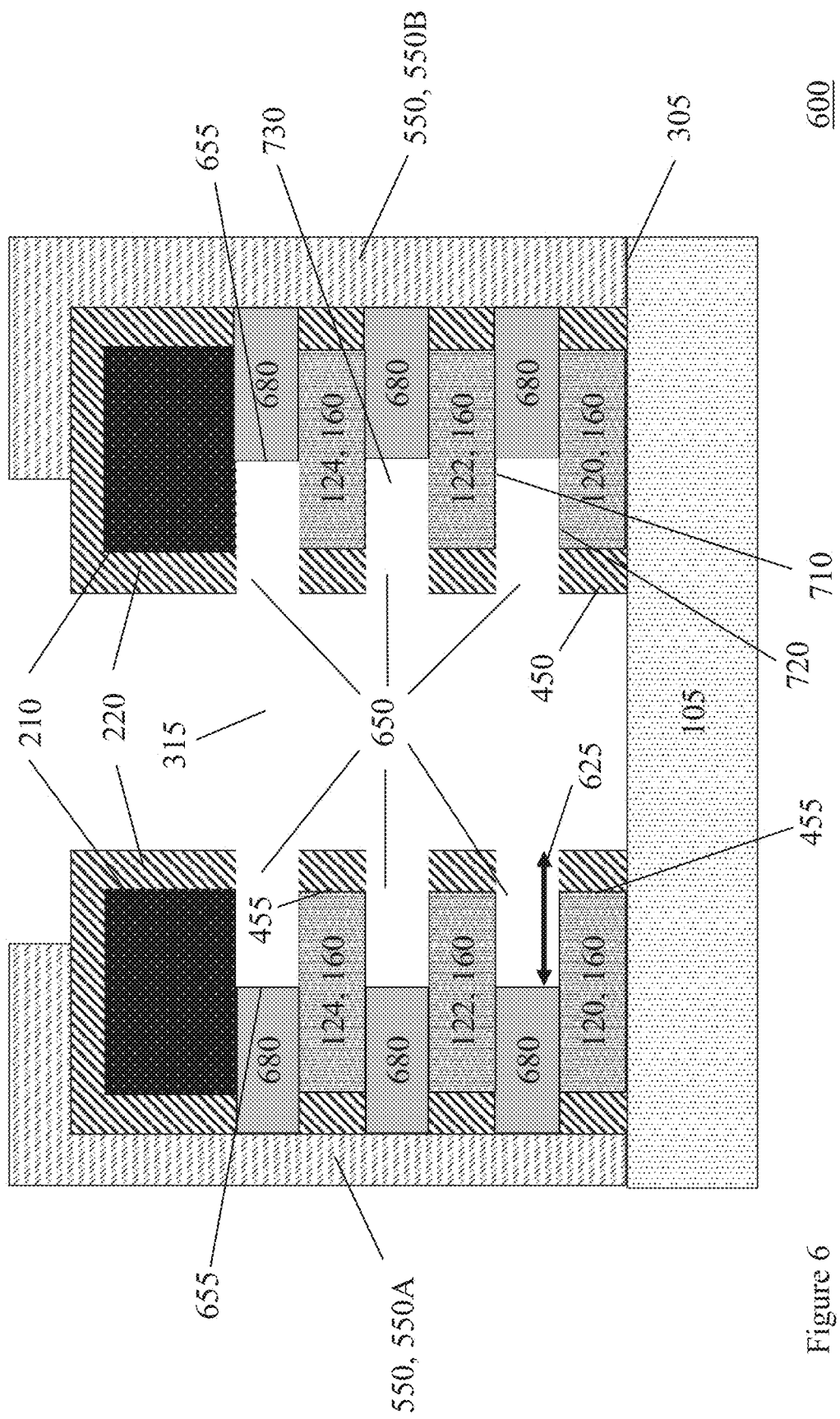
FIG. 6 is a cross-section view of an interim structure after a selective etching of the sides of one or more channel layers.

FIG. 6 is a cross-section view of an interim structure 600 after a selective etching step.

Since the half masks 550 leave region 315 exposed, channel layer ends, typically 655, of the channel layers 150 are exposed as well. An etching process step, e.g. a suitable timed wet or dry etch, is performed that selectively etches back/recesses 650 the material 150 in the channels 730 while having little or no effect on the gate spacers 220 and inner spacers 450 or the material masked by the gate spacers 220 and inner spacers 450, e.g. the ends 455 of the dummy layers 160.

The etch is continued until enough channel layer 150 material is removed to recess 650 about one-half 625 the width 325 of each of the channels 730, leaving an exposed channel layer 150 end 655 recessed into the channel 730 about one-half 625 the width 325 of the channel 730.

Silicon is selective etched with ammonium hydroxide ($NH_4OH$) solution at higher than room temperature. Other methods are available from TEL, Tokyo Electron Ltd.

The remaining channel layer 150 material in the channels 730 becomes a second side 680 of a p-n junction with an exposed channel layer end 655.

Figure 7:
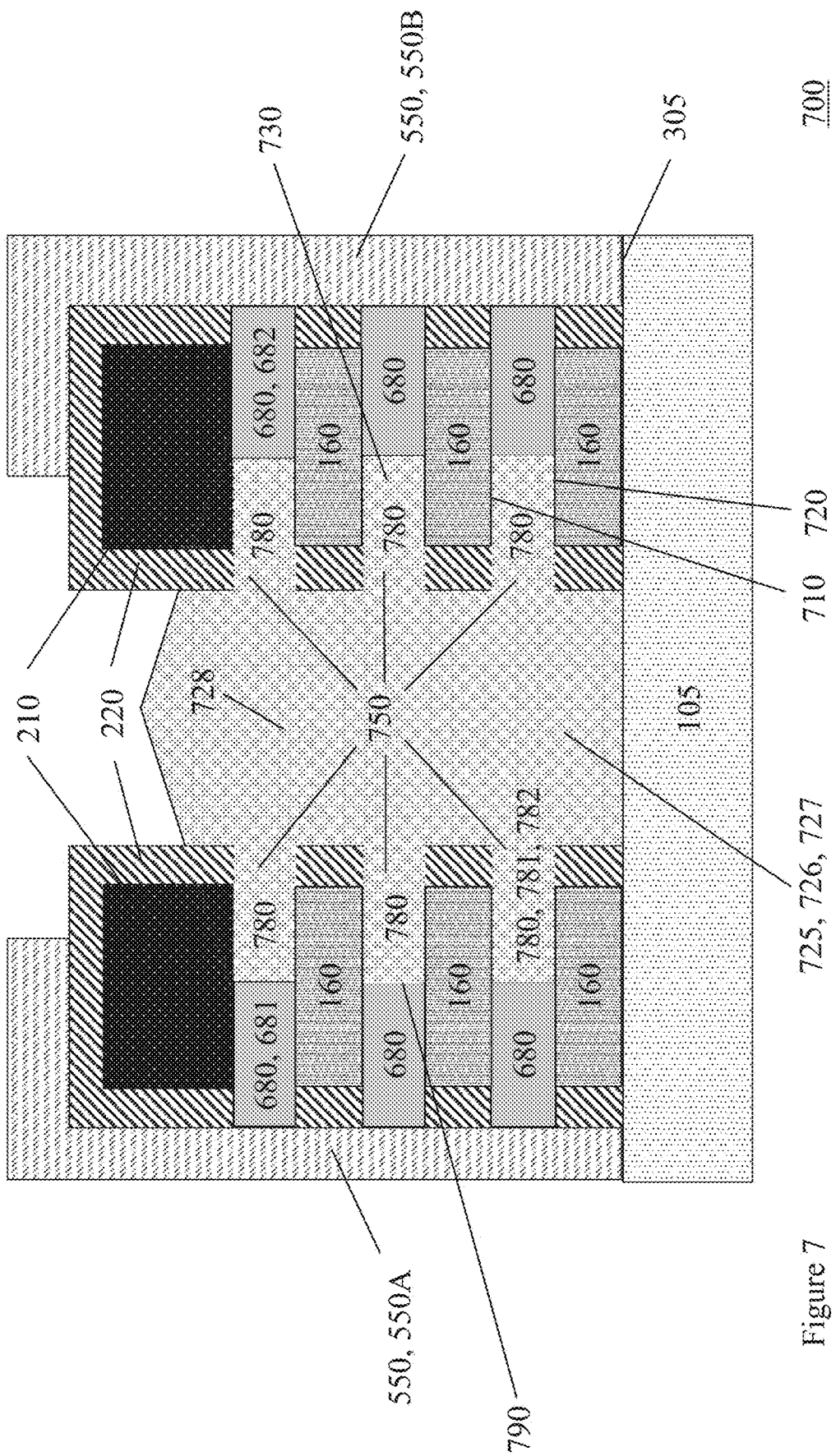
FIG. 7 is a cross-section view of an interim structure after an epitaxial growth of a first source/drain (S/D) which includes a channel epitaxy.

FIG. 7 is a cross-section view of an interim structure 700 after an epitaxial growth of a first source/drain (S/D) 725 using epitaxially growth and doping methods, as described above.

Because the exposed channel layer end 655 and the dummy gate material 160 are made of a semiconductor material, the first S/D 725 material will epitaxially grow on the bottoms (typically 720), tops (typically 710), and exposed channel layer ends 655 (semiconductor surfaces) of the exposed regions 650 within the channel 730. This channel epitaxy is a first part of the first S/D epitaxial growth 725.

In some embodiments, during the channel epitaxy, the exposed recesses 650 of the channel layers 150 are being filled 750 by the epitaxially growing material 750 (in this first part of the epitaxial growth of the first S/D 725—the channel epitaxy) at a doping level 781 kept at a lower level 781, e.g. a first p-n junction doping level 781.

As the epitaxial growth continues 728, in a second part of the epitaxial growth of the first S/D 725, the continuing epitaxial growth fills in the first S/D region 725 (e.g. further filling the former voided space 315). In this second part of the continuing epitaxial growth of the first S/D 725, the doping level 726 is increased to a higher level 726, e.g. a first source/drain doping level 726.

The switch to the higher first S/D doping concentration 726 is made after a time period sufficient enough to fill 750 the voids/exposed recesses 650 in the channel 730 to form a first side junction 780 with a first side junction doping level/concentration 781 and a first side junction doping type 782. Accordingly, a p-n junction 790 is formed by a timed channel epitaxial growth at a lower doping concentration 781 that forms the first side junction 780 in contact with the second side 680 of the p-n junction 790 in the channel, typically 730.

In other words, the doping level increases after the voided/exposed regions 650 are filled 750, forming the first side junction 780 made of material 750 having a first side junction doping level/concentration 781 and a first side junction doping type 782. After voided/exposed regions 650 are filled, the first S/D 725 continues to epitaxially grow 728 (second part of the first S/D epitaxial growth) with a higher first S/D doping concentration 726 and a first S/D doping type 727. Therefore, the first S/D doping type 727 and the first side junction doping type 782 are the same. In some embodiments, the material making the first S/D 725 and the material filling 750 the exposed recesses 650 in the channel 730 is the same first S/D material with the same doping type (727, 782) but different doping concentrations (726, 781). Other materials with different compositions but with adequate matched lattice structures are envisioned. In other words, in some embodiments, the first S/D material is changed from one first S/D material to another first S/D material, the one first S/D material and the another first S/D material being different materials but having a lattice structure that matches.

In some embodiments, the time at which the doping levels increase from the lower first side junction doping level/concentration 781 to the higher first S/D doping level/concentration 726 is determined empirically by experimentation.

According, a p-n junction or diode, typically 790, is now formed at each previously exposed channel layer end 655. The p-n junction/diode 790 has a first side, typically 780, and a second side, typically 680.

The filled 750 part of the channel 730 forms the first side 780 of a p-n junction/diode 790 that is physically and electrically connected to the first S/D 725. The first side 780 of the p-n junction/diode 790 is the same material as the first S/D material. The first side junction doping type 782 is the same as the first S/D doping type 727 but the first side junction doping concentration 781 is lower than the first S/D doping concentration 726.

The second side 680 of the p-n junction/diode 790 is the doped semiconductor material originally making up the channel layers 150, with the same doping type (second side junction doping type 682) and concentration (second side junction doping concentration 681/155) as the original channel layer 150.

In some embodiments, the filled 750 exposed recessed/voided 650 channels 730, i.e. the first sides 780 of a p-n junction 790, are doped at a first side junction doping level/concentration 781 between $1\times10^{19}$ $cm^{-3}$ and $4\times10^{20}$ cm while the first S/D 725 is doped at a first S/D doping concentration 726 between $8\times10^{20}$ $cm^{-3}$ and $2\times10^{21}$ $cm^{-3}$. The p-n junction/diode 790 is formed within the channel 730 because the first side junction 780 doping type 782 is opposite of the second side junction 680 doping type 682.

In a non-limiting example, the material/doping making up the first S/D 725 and the fill 750 in the exposed recesses 650 of the channel 730, i.e. the first side 780 of the p-n junction 790, is silicon n-type doped 782, e.g. with phosphorous (P). The second side of the junction/diodes 680 is made of p-type doped 682 silicon doped with boron (B). The second side junction doping (with boron, B) concentration 681 is between $1 \times 10$ cm and $1 \times 10^{19}$ cm$^3$. The first side junction 780 are n-type doped 782 silicon (with phosphorous, P) with a first side junction doping concentration 781 between $1 \times 10^{19}$ cm$^3$ and $4 \times 10^{20}$ cm$^{-3}$. Other doping levels are envisioned. The doping types (782, 682) and concentrations (781, 681) of the first 780 and second 680 sides can be in reversed positions in the channel 730.

Figure 8:
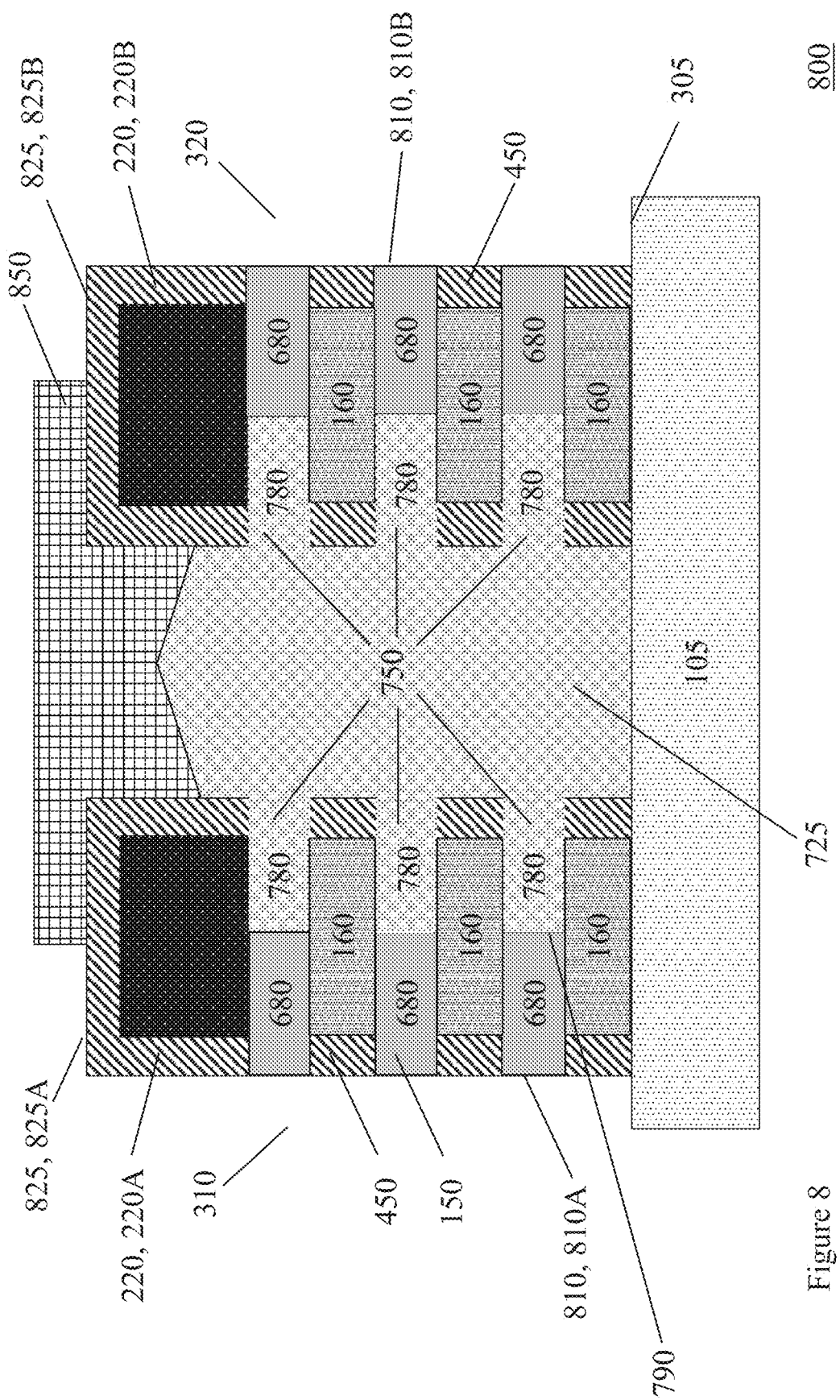
FIG. 8 is a cross-section view of an interim structure after deposition of an open area fill mask.

FIG. 8 is a cross-section view of an interim structure 800 after removal of the half masks 550 and deposition of an open area fill mask 850.

Removal of the pair (550A, 550B) half masks 550 is performed by a suitable wet or dry etch that removes the material making up the half masks 550 but has little effect on the gate spacers 220 and inner spacer 450.

Half mask 550 removal again exposes outside regions (310, 320) and the pair (825A, 825B) of tops 825 of the pair (220A, 220B) of the gate spacers 220. The outside edges, typically 810, of each pair (810A, 810B) of channels layers, typically 150, now the second side of the junction/diodes 680, are also exposed.

The fill mask 850 is deposited, e.g. with a lithographic process, to fill any voids above the first source/drain 725. In some embodiments, the fill mask 850 overlaps some of the tops 825 of the pair (825A, 825B) of tops 825 of the gate spacers 220. In some embodiments, a Chemical-Mechanical Polishing (CMP) is performed (not shown) to level the top of the structure 800.

The fill mask 120 is a protective material that protects the first source/drain 725 while the second source drains are epitaxially grown in the next step. The fill mask 120 dielectric material includes but is not limited to, any one of the following: silicon oxide (SiOx), silicon nitride (SiN), siliconborocarbonitride (SiBCN), silicon oxycarbonitride (SiOCN), and silicon oxynitride (SiON) and is deposited by know techniques like chemical vapor deposition (CVD) or physical vapor deposition (PVD).

Figure 9:
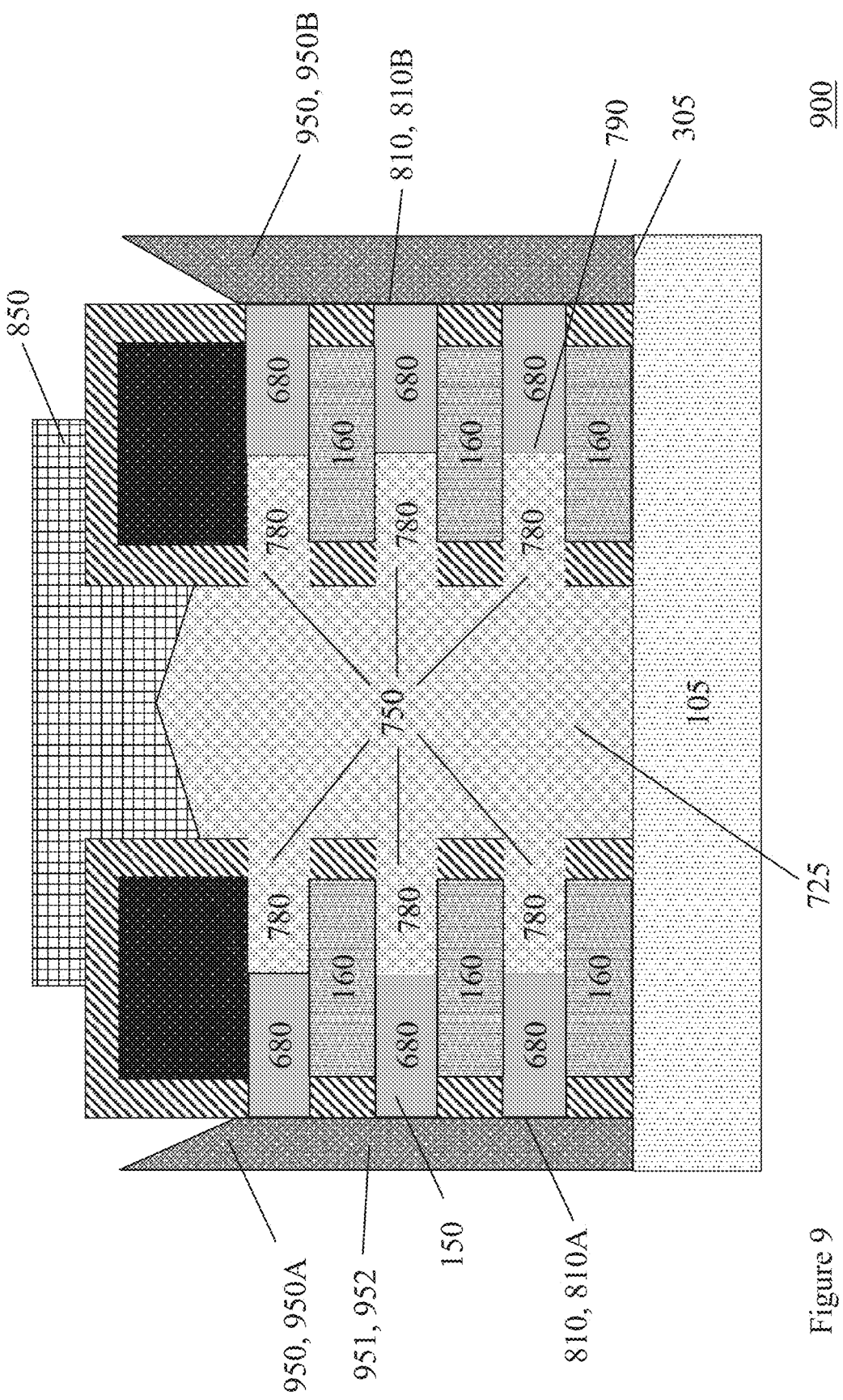
FIG. 9 is a cross-section view of an interim structure after an epitaxial growth of one or more second source drains.

FIG. 9 is a cross-section view of an interim structure 900 after an epitaxial growth of one or more, e.g. a pair (950A, 950B), of second source drains 950.

The pair (950A, 950B) of second S/D 950 is grown epitaxially as described above. During the epitaxial growth, each second source drain (950A, 950B) becomes electrically and physically connected to the outside edges (810A, 810B) of the channel layers 150 (now the second side 680 of a p-n junction/diode 790), respectively.

In some embodiments, there is a left second S/D 950A and a right second S/D 950B. The left second S/D 950A is electrically connected to the second sides 680 of the p-n junctions/diodes 790 in the left device stack (1160A in FIG. 11) and right second S/D 950B is electrically connected to all the second sides 680 of the p-n junctions/diodes 790 in the right device stack (1160B in FIG. 11).

The second source drains 950 will have the same second S/D doping type 952 as the channel layers 150/second p-n junction side 680. However, in some embodiments, the second S/D doping concentration 951 of the second source drains 950 will be higher than that of the second side 680 of a p-n junction/diode 790. For example, the second S/D doping concentration/levels 951 of the second source drains 950 is between level between $8 \times 10^{20}$ cm$^{-3}$ and $2 \times 10^{21}$ cm$^{-3}$.

In some embodiments, the second source drains 950 are doped with a p-type dopant, e.g. boron (B).

Figure 10:
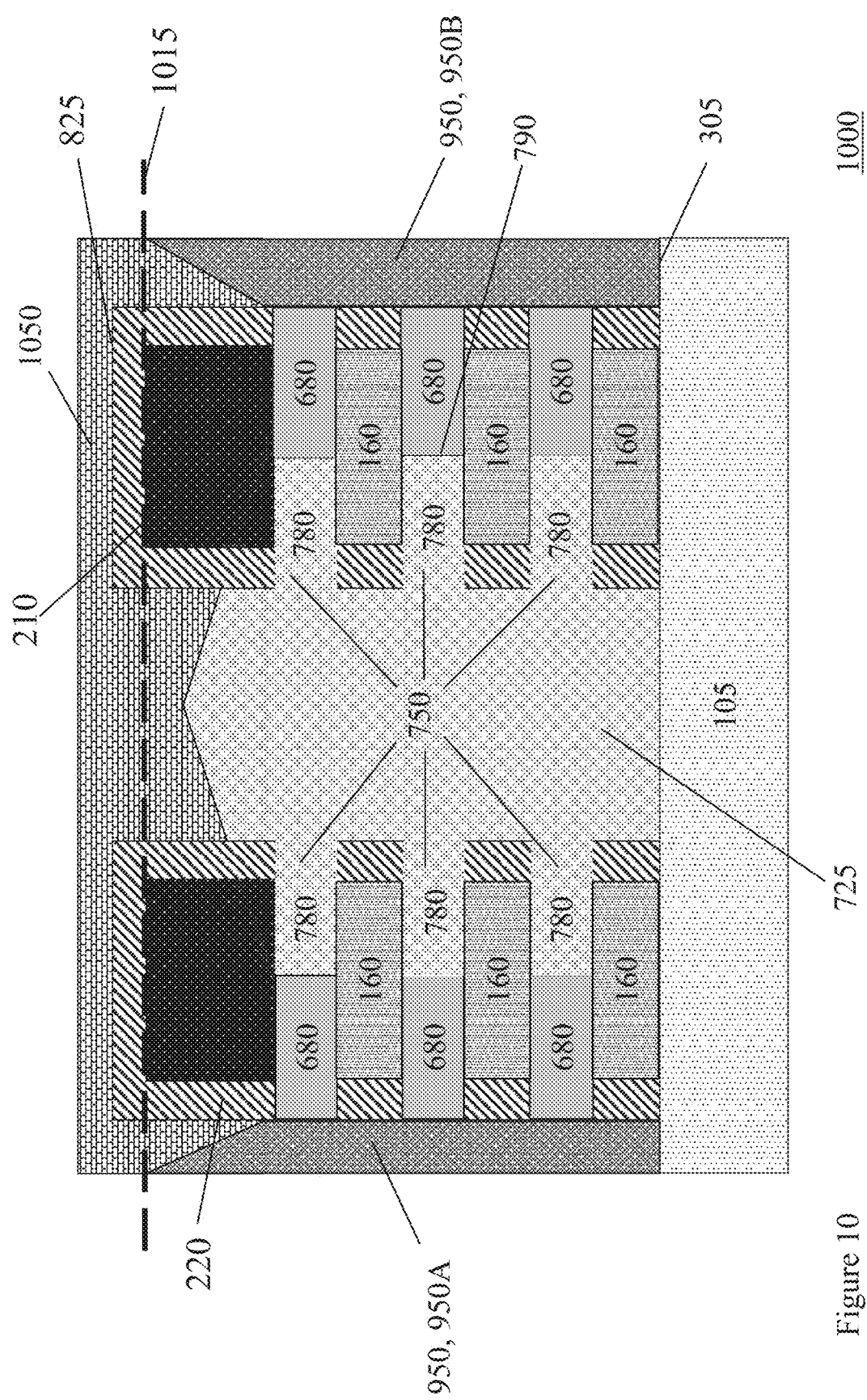
FIG. 10 is a cross-section view of an interim structure after removal of the area fill mask and deposition of an interlayer dielectric (ILD) fill.

FIG. 10 is a cross-section view of an interim structure 1000 after removal of the area fill mask 850 and deposition of an interlayer dielectric (ILD) fill 1050.

The fill mask 850 is removed by performing known selective wet and/or dry etch techniques.

The ILD fill 1050 may be formed from a low-k dielectric material (with k<4.0), including but not limited to, silicon oxide, spin-on-glass, a flowable oxide, a high-density plasma oxide, borophosphosilicate glass (BPSG), or any combination thereof. The ILD 1050 is deposited by other deposition processes, including, but not limited to CVD, PVD, PECVD, ALD, evaporation, chemical solution deposition, or like processes.

The ILD 1050 covers the structure 1000. However, in some embodiments, the ILD 1050 does not cover access from the front and/or back (out of and into the figure) of the all-around dummy gate layers (120, 122, 124, typically 160).

In some embodiments, the structure 1000 is planarized by known methods like CMP. In some embodiments, in addition to smoothing the top surface of the structure 1000, the CMP removes (not shown) the top part 825 of the gate spacer 220 and exposes the dummy gate 210 material. Line 1015 shows the level at which the CMP will stop in this case.

Figure 11:
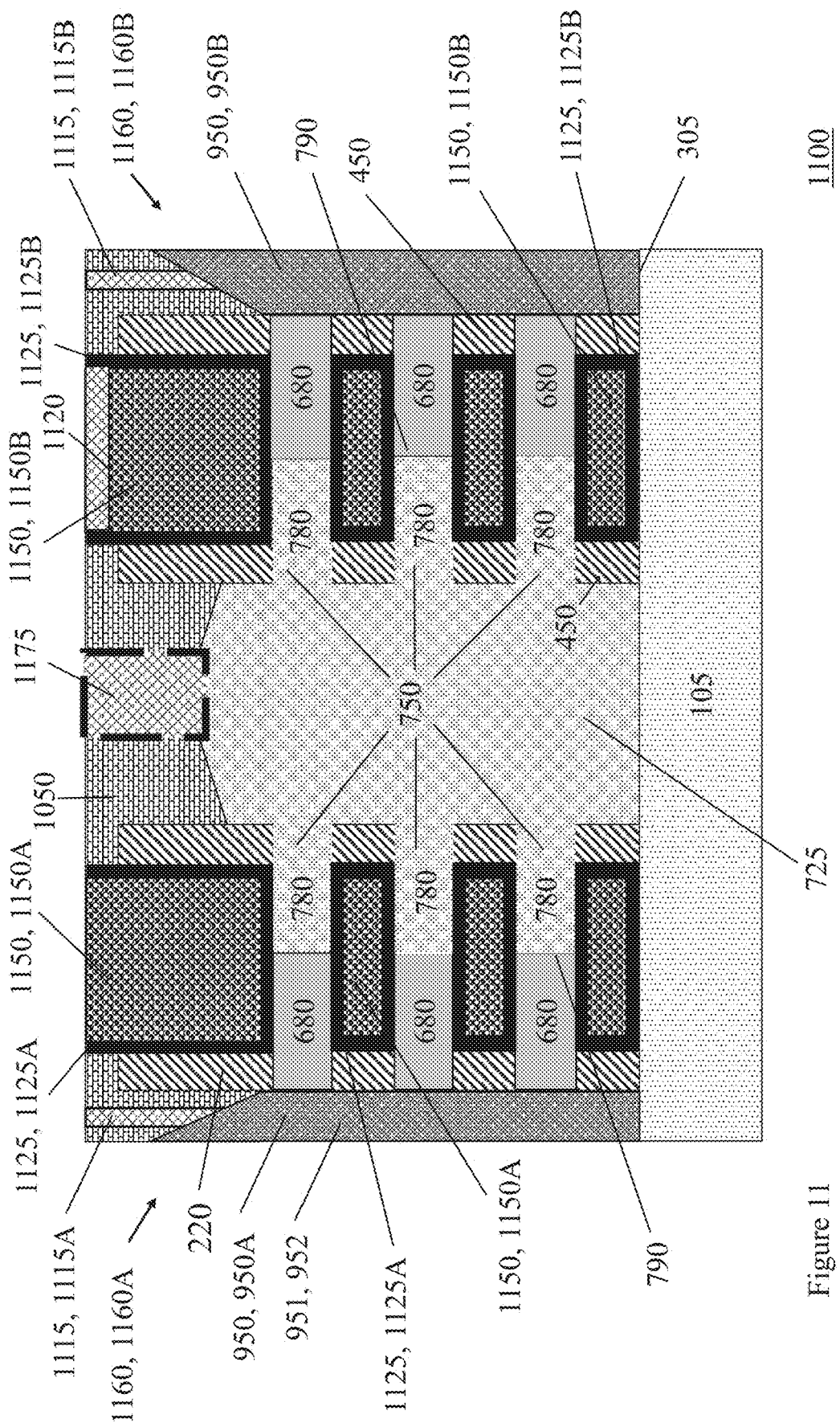
FIG. 11 is a cross-section view of an embodiment of one or more nanosheet gated diodes after formation of one or more gate stacks.

FIG. 11 is a cross-section view of an embodiment 1100 of a nanosheet gated diode 1100 after removal of the dummy gate 210 and the all-around dummy gate 160 material and formation of one or more gate stacks (1125, 1150).

The dummy gate 210 and the all-around dummy gate 160 material is removed by a release etch. In cases where the dummy gate 210 and the all-around dummy gate layers 160 are made of the same material, e.g. SiGe, only one release etch is required. In cases there the dummy gate 210 and the all-around dummy gate 160 are made of different materials, multiple release etches might be needed.

In some embodiments, the dummy gate 210 and the all-around dummy gates 160 are made of SiGe. In these conditions, the SiGe in the dummy gate 210 and all-around dummy gate 160 material (SiGe) between the channels 730 and inner spacers 450 can be selectively removed or pulled by a dry etch or exposure to ammonium hydroxide (NH$_4$OH) at higher than room temperature or exposure to a solution of hydrofluoric acid (HF).

The etching materials can access the dummy gate 210 from the top of the structure 1100, e.g. accessed from level 1015. The etching materials can access the materials in the all-around dummy gate 160 from the exposed sides on the front and back (not shown) of the structure 1100.

The release etch leaves voids (not shown) between the inner spacers 450 and channels 730 and where the dummy gate 210 material is removed. The tops 710 and bottoms 720 and fronts and backs (not shown), of the channels 730 and the respective p-n junctions, typically 790, formed in the channels 730 are also exposed.

Gate stacks (1125, 1150) are formed in the voided regions where between the inner spacers 450 and channels 730 and where the dummy gate 210 material is removed. A gate stack (1125, 1150) has a gate dielectric layer 1125 interfacing and surrounding the surface of the channels 730 and respective p-n junctions 790 within the channel 730 (and also on surfaces of the remaining gate spacer and inner spacer (220, 450) material. A metal gate 1150 fills the remainder of the space.

Note that there are two device stacks 1160, a first or left device stack 1160A and a second or right device stack 1160B.

The gate dielectric layer 1125 can be made of a dielectric material having a dielectric constant greater than 3.9, more preferably above 7.0, and still more preferably above 10.0. Non-limiting examples of suitable materials for the gate dielectric material 1125 include oxides, nitrides, oxynitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum.

The gate dielectric material 1125 layer may be formed by suitable deposition processes, for example, CVD, PECVD, ALD, PVD, evaporation, chemical solution deposition, or other like processes. The thickness of the gate dielectric material 1125 may vary depending on the deposition process as well as the composition and number of high-k dielectric materials used.

The gate metal layers 1150 include but are not necessarily limited to: titanium nitride (TiN), tantalum nitride (TaN) or ruthenium (Ru), titanium aluminum nitride (TiAlN), titanium aluminum carbon nitride (TiAlCN), titanium carbide (TiC), titanium aluminum carbide (TiAlC), tantalum aluminum carbide (TaAlC), tantalum aluminum carbon nitride (TaAlCN) or lanthanum (La) doped TiN, TaN. These gate metals 1050 are deposited using, for example, deposition techniques including, but not limited to, CVD, PECVD, PVD, ALD, LSMCD, Radio Frequency Chemical Vapor Deposition (RFCVD), Pulsed Laser Deposition (PLD), Liquid Source Misted Chemical Deposition (LSMCD), and/or sputtering.

In some embodiments, an external electrical contact 1175 is made with the first source/drain 725. One or more openings/trenches are created through the ILD 1150 using lithographic or laser techniques to expose the first source/drain 725. A silicide layer is then formed on the exposed surface of the first source/drain 725. A conductive material 1175 is deposited to fill the openings/trenches that forms the external electrical contact 1175 to the first source/drain 725.

In other embodiments, an external electrical contact, for example 1120, can also be made to the gate working metal 1150 and/or the second source drains 950, e.g. 1115. As before, where necessary opening/trenches can be made to contact the respective contacts, i.e. the gate metal (1150) and/or the second source/drain(s) 950. A silicide layer is formed on exposed surfaces of semiconductor material. Then the conductive material 1120 is deposited to fill the opening/trenches.

In this way, external connections 1115 are made to each of the second S/Ds 950. External connection 1115A is made to second S/D 950A and external connection 1115B is made to second S/D 950B.

The conductive material (1120, 1175, 1115) may be a conductive metal like aluminum (Al), platinum (Pt), gold (Au), tungsten (W), titanium (Ti), Cobalt (Co) or any combination thereof. The conductive material (1120, 1175) may be deposited by a suitable deposition process, for example, CVD, PECVD, PVD, plating, thermal or e-beam evaporation, or sputtering.

A typical known silicide formation process includes depositing a metal (like Ni) on a semiconductor surface, followed by an annealing, e.g. between 410 and 425 degrees Celsius for about 15 minutes, and then removing the unreacted metal.

A CMP may be performed to level the surface of the device 1100.

In embodiments where the pair (1125A, 1150A, 1125B, 1150B) of gate stacks (1125, 1150) completely surround (upper 710 and lower 720 and front and back) the channels 730 and p-n junctions 790, all parts of the gate stacks (1125, 1150) are at substantially the same voltage potential, since the gate metal in each (1150A, 1150B) of the pair (1160A, 1160B) device stacks 1160 are connected to a common connection 1150. Therefore, substantially the same voltage applied to the respective gate connections (1150A, 1150B) causes the electric field in all the channels 730 and p-n junctions 790 within each (1160A, 1160B) of the device stacks 1160.

In some embodiments, each of the multiple diodes 790 in each (1160A, 1160B) device stack 1160 are connected in parallel. The parallel connected diodes 790 in each (1160A, 1160B) device stack 1160 can in turn be connected in parallel.

In this embodiment, the current through the entire gated diode device 1100, e.g. the current through the first 725 and second 950 source/drains, is approximately multiplied by the number of diode paths. In other words, the current capacity of the gated diode 1100 increases with the number of diodes 790 electrically connected in parallel.

Stacking the diodes 790 in a vertical direction (perpendicular to the substrate 105) enables a high current capacity diode (connected group of diodes) in a reduced area on the substrate 105.

The voltage/signal applied to the gate stacks 1125/1150 surrounding the diodes 790, modulates the current-voltage characteristics of the diodes 790 and therefore the current-voltage characteristics of the gated diode device 1100. In one embodiment, the break-down voltage of the gated diode device 1100 is a function of the voltage applied to the gate stacks 1125/1150.

Figure 12:
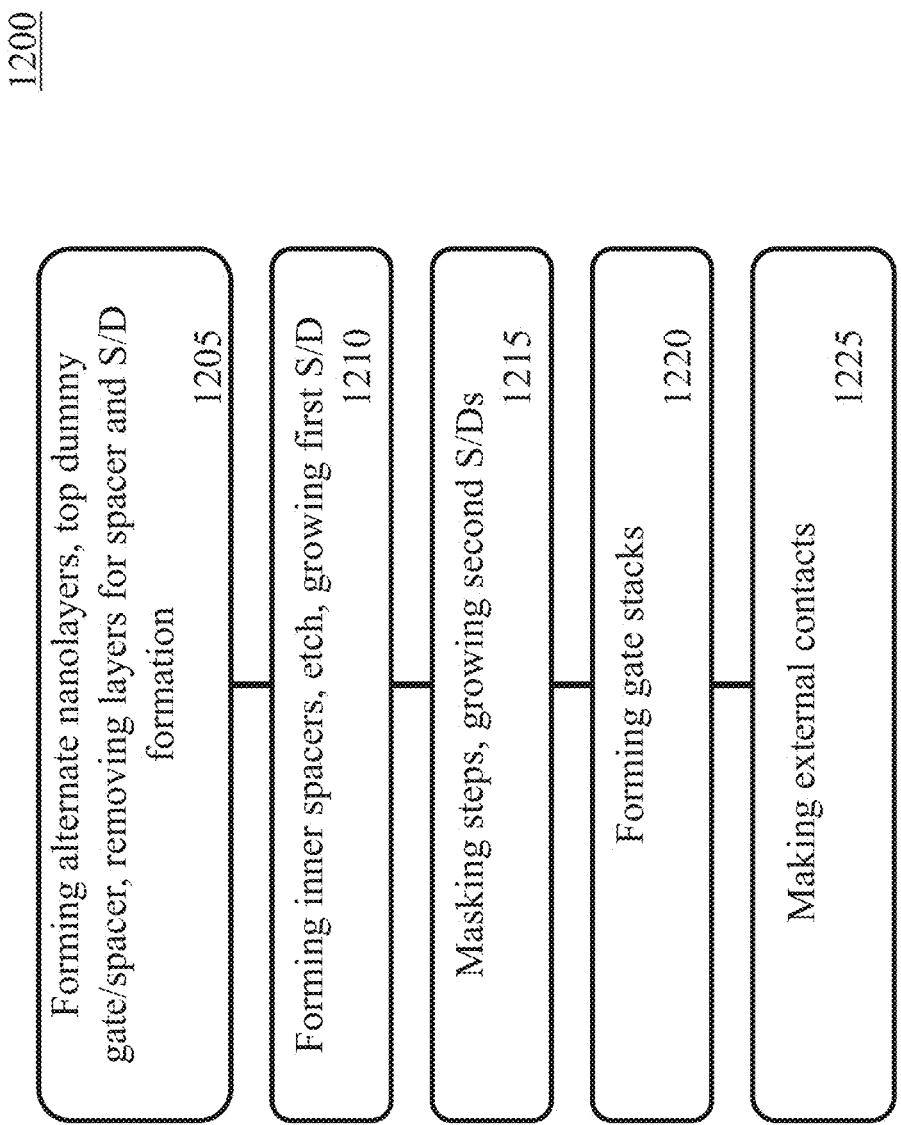
FIG. 12 is a flow chart with method steps of making a nanosheet gated diode.

FIG. 12 is a flow chart of a process 1200 with method steps of making a nanosheet gated diode, e.g. 1100.

The method begins with step 1305 by forming the alternate nanolayers 140, depositing the pairs (210A, 210B) of dummy gates 210 and the pairs (220A, 220B) of gate spacers 220, and removing material (310, 315, and 320) to prepare for the formation of the inner spacers 450.

In step 1210, the inner spacers 450 are formed on the exposed ends 455 of what remains of the dummy gate layers 160. The channel layers 150 are etched exposing the channel layer ends 655 and voids 650 in the channels 730. The first source/drain (S/D) 725 is epitaxially grown (first part of first S/D growth) and the p-n junctions/diodes 790 are formed at a first side junction doping level/concentration 781 and a first side junction doping type 782. After the first side 780 of the p-n junction 790 is formed (second part of first S/D growth), the doping level of the first source/drain (S/D) 726 is increased to a first S/D doping level 726.

In step 1215, the first source/drain 725 is masked with the open area fill mask 850 and the left 950A and right 950B second S/Ds 950 are grown. The second S/Ds 950 has a second S/D type doping 952, the same doping type (682, 150) of the second side 680 of the p-n junction 790. The second S/D 950 doping level/concentration 951 increases to be greater than that 681/155 of the second side 680.

In step 1220 the gate stacks (1125, 1150) are formed, as described above.

In step 1225 the external connections (1115, 1120, 1175) are made for the gated diodes 790.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. For example, the semiconductor devices, structures, and methods disclosed in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, expert and artificial intelligence systems, functional circuitry, etc. Systems and hardware incorporating the semiconductor devices are contemplated embodiments of the invention.

The terminology used herein was chosen to explain the principles of the embodiments and the practical application or technical improvement over technologies found in the marketplace or to otherwise enable others of ordinary skill in the art to understand the embodiments disclosed herein. Devices, components, elements, features, apparatus, systems, structures, techniques, and methods described with different terminology that perform substantially the same function, work in the substantial the same way, have substantially the same use, and/or perform the similar steps are contemplated as embodiments of this invention.

We claim:

1. A gated nanosheet diode comprising:
   a substrate;
   a first source/drain (S/D) disposed on the substrate, the first S/D having a first S/D doping concentration with a first S/D doping type;
   a second source/drain (S/D) disposed on the substrate, the second S/D having a second S/D doping concentration with a second S/D doping type;
   a p-n junction forming a diode;
   a first side of the p-n junction, the first side having a first side junction doping concentration with a first side junction doping type, the first side junction doping type being the same as the first S/D doping type and the first side of the p-n junction electrically and physically connected to the first S/D;
   a second side of the p-n junction, the second side having a second side junction doping concentration with a second side junction doping type, the second side junction doping type being the same as the second S/D doping type and the second side of the p-n junction electrically and physically connected to the second S/D;
   a gate dielectric layer interfacing and surrounding the p-n junction; and
   a gate metal surrounding the gate dielectric layer, the gate metal and the gate dielectric layer forming a gate stack surrounding the p-n junction.

2. A gated nanosheet diode, as in claim 1, where the first side junction doping type and the first S/D doping type are n-type doped.

3. A gated nanosheet diode, as in claim 2, where the n-type dopants are one of the following: phosphorus (P), arsenic (As), and antimony (Sb).

4. A gated nanosheet diode, as in claim 2, where a first side junction doping concentration is between $1\times10^{19}$ cm$^{-3}$ and $4\times10^{20}$ cm$^{-3}$ and the first S/D doping concentration is between $8\times10^{20}$ cm$^{-3}$ and $2\times10^{21}$ cm$^{-3}$.

5. A gated nanosheet diode, as in claim 1, where the second side junction doping type and the second S/D doping type are p-type dopants.

6. A gated nanosheet diode, as in claim 5, where the p-type dopants are one of the following: boron (B), gallium (Ga), indium (In), and thallium (TI).

7. A gated nanosheet diode, as in claim 2, where a second side junction doping concentration is between $1\times10^{17}$ cm$^3$ and $1\times10^{19}$ cm$^{-3}$ and the second S/D doping concentration is between $8\times10^{20}$ cm$^{-3}$ and $2\times10^{21}$ cm$^{-3}$.

8. A gated nanosheet diode, as in claim 1, where the first side junction doping type and the first S/D doping type are p-type doped.

9. A gated nanosheet diode, as in claim 8, where a first side junction doping concentration is between $1\times10^{17}$ cm$^{-3}$ and $1\times10^{19}$ cm$^{-3}$ and the first S/D doping concentration is between $8\times10^{20}$ cm$^{-3}$ and $2\times10^{21}$ cm$^{-3}$.

10. A gated nanosheet diode, as in claim 1, where the second side junction doping type and the second S/D doping type are n-type dopants.

11. A gated nanosheet diode, as in claim 10, where a second side junction doping concentration is between $1\times10^{19}$ cm$^{-3}$ and $4\times10^{20}$ cm$^{-3}$ and the second S/D doping concentration is between $8\times10^{20}$ cm$^{-3}$ and $2\times10^{21}$ cm$^{-3}$.

12. A gated nanosheet diode comprising:
    a substrate;
    a first source/drain (S/D) disposed on the substrate, the first S/D having a first S/D doping concentration with a first S/D doping type;
    two or more second source/drain (S/Ds) disposed on the substrate, the second S/Ds having a second S/D doping concentration with a second S/D doping type, one of the second S/Ds being a right second S/D and one of the second S/Ds being a left second S/D;
    one or more p-n junctions, each p-n junction forming a diode in a separate channel, each of the diodes and the channels being surrounded by a gate stack, the gate stack having a gate dielectric layer interfacing and surrounding each of the p-n junctions and a gate metal surrounding the gate dielectric layer;
    two or more device stacks formed by one or more of the diodes stacked upon one another, a left device stack being between the left second S/D and the first S/D and the right second right device stack being between the right second S/D and the first S/D;
    a first side of each of the p-n junctions, the first side having a first side junction doping concentration with a first side junction doping type, the first side junction doping type being the same as the first S/D doping type and the first sides of the p-n junctions electrically and physically connected to the first S/D;
    a second side of the p-n junction, the second side having a second side junction doping concentration with a second side junction doping type, the second side junction doping type being the same as the second S/D doping type and the second side of the p-n junctions in the left stack electrically and physically connected to the left second S/D and the p-n junctions in the right stack electrically and physically connected to the right second S/D,
    where the first sides of the p-n junctions in the left and right stack being electrically connected to the first S/D forms a plurality of the diodes electrically connected in parallel.

13. A gated nanosheet diode, as in claim 12, where the gate metal surrounding the gate dielectric layer and each of the diodes is electrically connected in common.

14. A gated nanosheet diode, as in claim 12, where a current capacity of the gated diode increases with the number of diodes.

15. A method of making a gated nanosheet diode comprising the steps of:
   forming an interim layered structure from a plurality of nanolayers, the nanolayers being one or more channel layers and one or more dummy gate layers, the channel layers and dummy gate layers disposed, alternating, one on the other, to form the interim layered structure, the channel layers being a semiconductor material with a second side junction doping concentration and a second side junction doping type;
   depositing two dummy gates each covered by a gate spacer layer on the interim layered structure;
   using the gate spacer layers as a mask, creating a pair of stacks from the interim layered structure by removing the nanolayers between and beside the stacks;
   forming an inner spacer on each of one or more exposed ends of the dummy gate layers;
   removing part of each of the channel layers to expose a channel layer end of each channel layer within a channel, the channel layer now being a second side junction;
   epitaxially growing a channel epitaxy as a first part of a first S/D epitaxial growth, the channel epitaxy growing a first side junction within the channel and creating a p-n junction/diode at the exposed channel layer where the first side junction contacts the second side junction, the first side junction having a first side junction doping concentration and a first side junction doping type opposite of the second side junction doping type;
   continuing the first S/D epitaxial growth to grow a first S/D with a first S/D doping concentration and a first S/D doping type, the first side junction doping type and the first S/D doping type being the same and the first S/D doping concentration being higher than the first side junction doping concentration;
   epitaxially growing a second source/drain (S/D) with a second S/D doping concentration and a second S/D doping type, the second S/D in electrical contact with the second side junctions, the second S/D doping type being the same as the second side junction doping type and the second S/D doping concentration being higher than the second side junction doping concentration; and
   forming a gate stack around one or more of the p-n junction/diodes.

16. A method, as in claim 15, where the first side junction doping concentration is increased to the first S/D doping concentration after the p-n junction/diodes are formed.

17. A method, as in claim 16, where the channel epitaxy is a timed epitaxial growth.

18. A method, as in claim 15, where the part of each of the channel layers removed exposes the channel layer end at about one half a width of the channel layer.

19. A method, as in claim 15, where the first S/D doping concentration and the second S/D doping concentration are between $8\times10^{20}$ cm$^{-3}$ and $2\times10^{21}$ cm$^{-3}$.

20. A method, as in claim 15, where the gate stack has a gate dielectric layer interfacing and surrounding each of the p-n junctions and a gate metal surrounding the gate dielectric layer and the gate metal is one or more of the following: titanium nitride (TiN), tantalum nitride (TaN) or ruthenium (Ru), titanium aluminum nitride (TiAlN), titanium aluminum carbon nitride (TiAlCN), titanium carbide (TiC), titanium aluminum carbide (TiAlC), tantalum aluminum carbide (TaAlC), tantalum aluminum carbon nitride (TaAlCN) or lanthanum (La) doped TiN, TaN.

\* \* \* \* \*